United States Patent
Leventis et al.

(10) Patent No.: US 7,185,306 B1
(45) Date of Patent: Feb. 27, 2007

(54) METHOD AND APPARATUS FOR ENHANCING SIGNAL ROUTABILITY

(75) Inventors: Paul Leventis, Toronto (CA); David Cashman, Toronto (CA)

(73) Assignee: Altera Corporation, San Jose, CA (US)

( * ) Notice: Subject to any disclaimer, the term of this patent is extended or adjusted under 35 U.S.C. 154(b) by 367 days.

(21) Appl. No.: 10/915,647

(22) Filed: Aug. 9, 2004

(51) Int. Cl.
*G06F 17/50* (2006.01)

(52) U.S. Cl. .................................. 716/13
(58) Field of Classification Search ............ 716/13
See application file for complete search history.

(56) References Cited

U.S. PATENT DOCUMENTS 6,530,070 B2 * 3/2003 Kruse ..................... 716/16
6,944,809 B2 * 9/2005 Lai et al. ................. 714/725
7,107,565 B1 * 9/2006 Lindholm et al. ........... 716/16

* cited by examiner

*Primary Examiner*—Vuthe Siek
(74) *Attorney, Agent, or Firm*—Martine Penilla & Gencarella, LLP

(57) ABSTRACT

A method for enhancing signal routability within an integrated circuit is provided. The method initiates with examining an outer edge of a sequence of logical array blocks. The method includes identifying an undriven routing wire in a vicinity of the outer edge. An underutilized driver proximate to the undriven routing wire is also identified. Then, the underutilized driver is coupled to the undriven routing wire. A computer readable medium and an integrated circuit are also provided.

23 Claims, 6 Drawing Sheets

Fig. 1 *(prior art)*

METHOD AND APPARATUS FOR ENHANCING SIGNAL ROUTABILITY

BACKGROUND OF THE INVENTION

1. Field of the Invention

This invention relates generally to Integrated Circuits and, in particular, to routing wires within a programmable logic device (PLD).

2. Description of the Related Art

The basic building block of the PLD is a logic element that is capable of performing limited logic functions on a number of input variables. The logic element is typically equipped with circuitry to programmably implement the "sum of products" logic, as well as one or more registers to implement sequential logic. Conventional PLDs combine together large numbers of such logic elements through an array of programmable interconnections to facilitate implementation of complex logic functions. PLDs have found particularly wide application as a result of their combined low up-front cost and versatility to the user.

A variety of PLD architectural approaches arranging the interconnect array and logic elements have been developed to optimize logic density and signal routability between the various logic elements. The logic elements are arranged in groups of, for example, eight to form a larger logic array block (LAB). Multiple LABs are arranged in their two-dimensional array and are programmably connectable to each other through global horizontal and vertical interconnect channels. Each of the horizontal and vertical interconnect channels include one or more routing wires. Signals that are routed to and from the logic regions over vertical and horizontal conductors form signal paths. Particular circuitry, including, for example, pass gates, multiplexors, and drivers may be used to couple and drive signals onto horizontal or vertical wires, or to receive signals from the horizontal or vertical wires and drive them to the logic regions. Circuitry-forming connections between horizontal wires, vertical wires, and logic regions may be programmable. One example of a programmable connection is a pass gate coupled through a random access memory bit circuit where the pass gate programmably connects a vertical wire to an input multiplexor of the logic region. Other examples may include connections based upon static or dynamic random access memory, electrically erasable read-only memory, flash, fuse and anti-fuse programmable connections.

FIG. 1 is a simplified schematic diagram illustrating the implementation of an H4 segmented wiring scheme on a right edge of a chip. As can be seen, at the right edge of the chip, because of the regular pattern defined by the H4 segmented wiring scheme, undriven wires 100 result. It should be appreciated that undriven wires 100 would have been associated with a driver had there been any logic blocks to the right of Input/Output (IO) block 102. Similarly, some of the wires that drive towards the right edge of the chip are relatively short because of the truncation effects due to the proximity to the edge of the chip. For example, wires 104 are associated with either one or two LAB blocks because of the edge effects. It should be appreciated that similar effects occur at the left and vertical edges of the chip, as well as any core intrusion in the chip such as large random access memory, microprocessors, and the phase lock loop (PLL) block. Wires 104 are associated with drivers that are configured to drive signals to 4 LABs. However, due to the short length of the wires the driver/wire configuration can only communicate with three or fewer LABs, or a single I/O block.

As a result, there is a need to solve the problems of the prior art to more efficiently utilize the signal driving capacity of the underutilized drivers at the edge of a chip having a segmented routing scheme.

SUMMARY OF THE INVENTION

Broadly speaking, the present invention fills these needs by providing a method and apparatus for utilizing the undriven wires at the chip edge to enhance signal routability. It should be appreciated that the present invention can be implemented in numerous ways, including as a method, a system, or an apparatus. Several inventive embodiments of the present invention are described below.

In one embodiment, a method for enhancing signal routability within an integrated circuit is provided. The method initiates with examining an outer edge of a sequence of logical array blocks. The method includes identifying an undriven routing wire in a vicinity of the outer edge. An underutilized driver proximate to the undriven routing wire is also identified. Then, the underutilized driver is coupled to the undriven routing wire.

In another embodiment, a computer readable medium having program instructions for enhancing signal routability within an integrated circuit is provided. The computer readable media includes program instructions for identifying an undriven routing wire in a vicinity of an outer edge of the integrated circuit and program instructions for identifying an underutilized driver proximate to the undriven routing wire. Program instructions for coupling the underutilized driver to the undriven routing wire are included.

In yet another embodiment, a programmable logic array integrated circuit is provided. The programmable logic array integrated circuit includes an array of logical array blocks (LABs). A plurality of driven wires defining a routing pattern between the LABs is included. A portion of the plurality of the driven wires are associated with corresponding underutilized drivers. A plurality of undriven wires located proximate to outer edges of the array of LABs are included. A first via providing a first connection between a first one of the plurality of undriven wires and an underutilized driver is also included.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 5 illustrates a change in the role of a driver through the via programming in accordance with one embodiment of the invention.

DETAILED DESCRIPTION OF THE PREFERRED EMBODIMENTS

An invention is described for an apparatus and method for enhancing signal routability at the edge of a chip having a segmented routing scheme. It will be obvious, however, to one skilled in the art, that the present invention may be practiced without some or all of these specific details. In other instances, well known process operations have not been described in detail in order not to unnecessarily obscure the present invention.

A programmable logic device is a digital, user-configurable integrated circuit used to implement a custom logic function. For the purposes of this description, the term PLD encompasses any digital logic circuit configured by the end-user, and includes a programmable logic array, a field programmable date array, and an erasable and complex PLD. The embodiments described herein provide for the enhancement of signal routing in a segmented/staggered wiring scheme, e.g., an H4 wiring scheme. The implementation of the wiring schemes described herein may be accomplished through programmed driver-to-wire connections without the need for additional hardware. Exemplary programming techniques include connections based upon static or dynamic random access memory, electrically erasable read-only memory, flash, fuse and anti-fuse programmable connections, metal mask programs, etc. Thus, the signal routing enhancements described herein do not require more silicon area. In one embodiment, the need for additional drivers to connect to the undriven wires is not necessary, thereby reducing the amount of silicon area associated with the signal routability architecture. Accordingly, the benefits of the segmented wiring scheme, i.e., simplification of the building of scalable chips, are further enhanced with increased signal routing flexibility provided by the embodiments described below.

Figure 1:
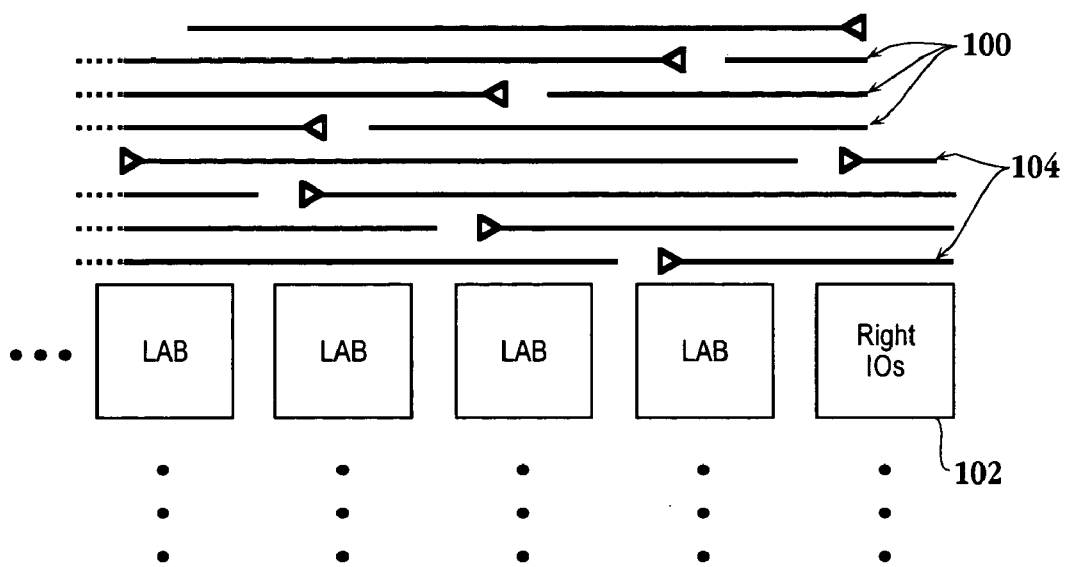
FIG. 1 is a simplified schematic diagram illustrating the implementation of an H4 segmented wiring scheme on a right edge of a chip.
Figure 2:
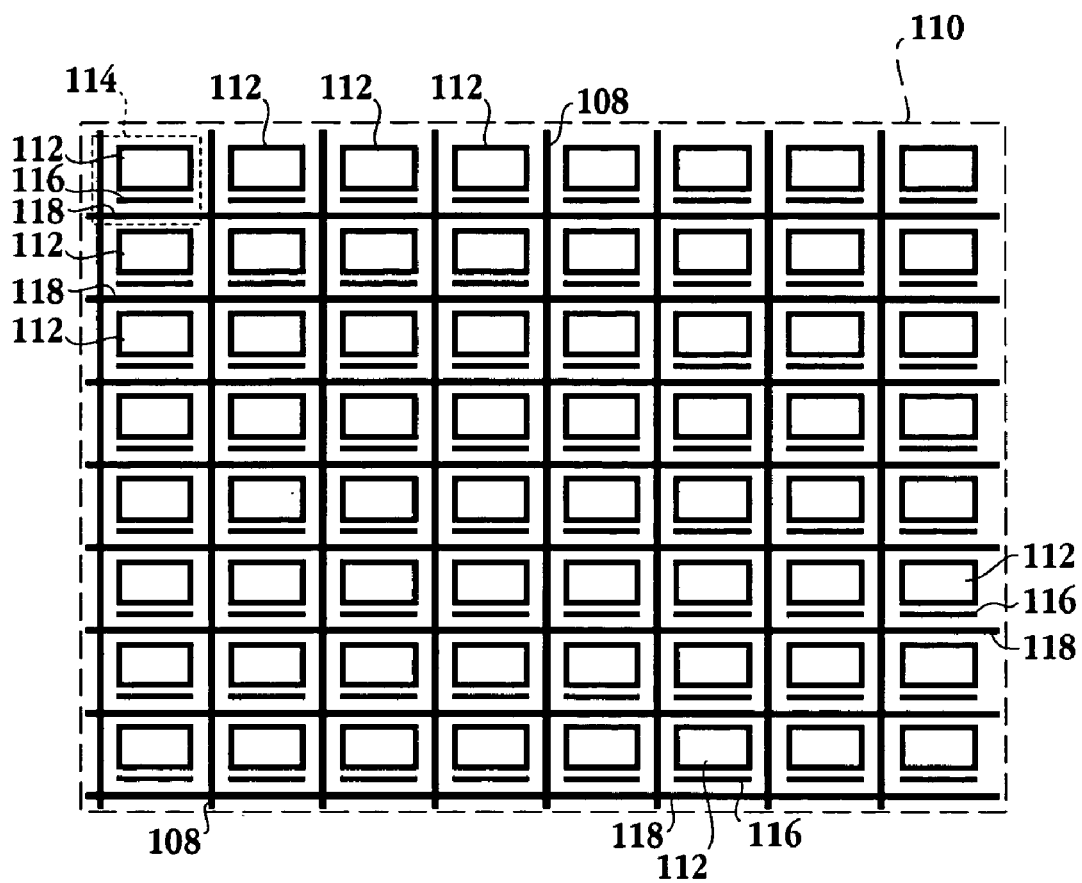
FIG. 2 is a simplified schematic diagram illustrating a programmable logic array integrated circuit in accordance with one embodiment of the invention.

FIG. 2 is a simplified schematic diagram illustrating a programmable logic array integrated circuit in accordance with one embodiment of the invention. Programmable logic array integrated circuit 110 includes a two-dimensional array of programmable logic elements 112. In one embodiment, these programmable logic elements are logic array blocks. Thus, integrated circuit 110 represents an 8×8 two-dimensional array of 64 LABs 112. As illustrated in region 114, each LAB 112 is associated with a plurality of signal conductors 116 which may be used to convey signals between programmable logic elements within a particular LAB. Additionally, a plurality of signal conductors 118 are associated with each horizontal row of LABs 114. These signal conductors may be used to convey signals between LABs of the associated horizontal row of LABs. In one embodiment, one channel, referred to as a bundle, of eight wires may be replicated ten times to provide signal routability between the LABs. In another embodiment, each of the LABs 112 includes 16 programmable logic elements or macrocells. In one exemplary configuration, each of these logic elements includes a D-type flip-flop and four input look up table elements as well as a tri-state driver. In addition to the above-described horizontal signal conductors, there are also vertical signal conductors 108. It should be appreciated that for illustrative purposes FIGS. 2–7 provide a logical illustration of the signal routing wires. That is, the signal routing wires are intermingled amongst the LABs and not all physically placed above the LABs as illustrated in FIGS. 3–7.

Figure 3:
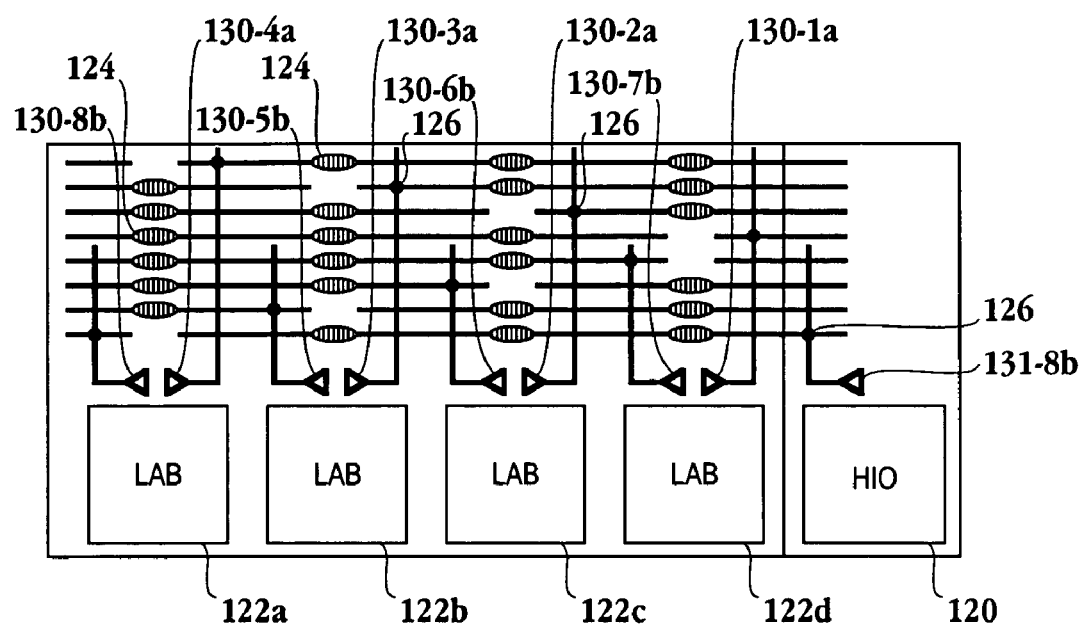
FIG. 3 is a simplified schematic diagram illustrating via and metal connections defined in order to achieve an H4 segmented wiring scheme.

FIG. 3 is a simplified schematic diagram illustrating via and metal connections defined in order to achieve an H4 segmented wiring scheme. It will be apparent to one skilled in the art that a single LAB layout is stamped out, and then vias and metal are dropped into the layout in order to define the segmentation/rotation of the wires and corresponding drivers illustrated in FIG. 2. This stamping and programming process additionally connects a driver to a corresponding wire. It should be appreciated that the horizontal input/ output (HIO) block 120 of FIG. 3 may use its own layout. For example, additional drivers may be added to HIO block 120 and connected to any of the undriven wire fragments at the chip edge. This will enable an increase in the number of signals that can be routed from the horizontal input/output block in the event that the signal demand is relatively high. LABs 112a through 122d represent a right hand edge of the programmable logic array with reference to FIG. 2. Each of LABs 122a through 122d of FIG. 3 are associated with a corresponding first driver (130-1a through 130-4a), which is connected to a wire directed to the right hand edge of the chip. Additionally, each of LABs 122a through 122d are associated with a corresponding second driver (130-4b through 130-8b), which is connected to a wire directed towards the inside of the chip. Each of drivers 130-1a through 130-4a and 130-5b through 130-8b are connected to the respective wire through a corresponding via 126. Additionally, metal options 124 are included in order to provide the wire connectivity desired.

Figure 4:
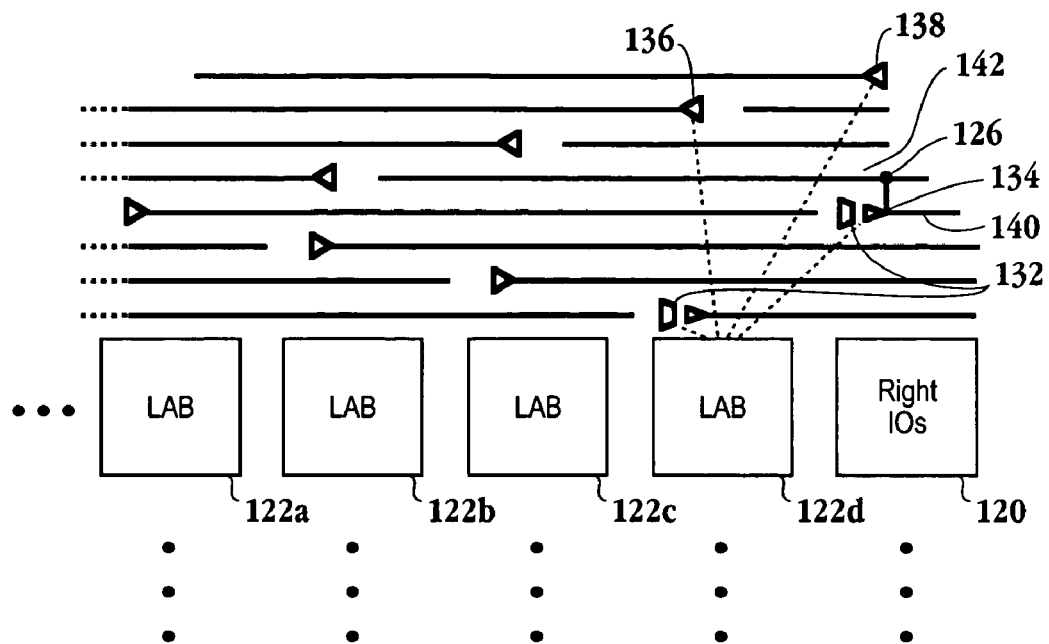
FIG. 4 is a simplified schematic diagram illustrating the programming to enable a driver to be connected to a left-going wire towards the inside of the chip rather than a right-going wire at the edge of the chip in accordance with one embodiment of the invention.

FIG. 4 is a simplified schematic diagram illustrating the programming to enable a driver to be connected to a left-going wire towards the inside of the chip rather than a right-going wire at the edge of the chip in accordance with one embodiment of the invention. It should be appreciated that the driver associated with each of LABs 122a through 122d may either drive a signal to the left or right depending on the direction/orientation of the wire. Here, driver 130-1a which was previously associated with wire fragment 140 is now connected to wire 142 through via 126. This reconfiguration may be accomplished through the programming techniques described above. As can be seen, wire 142 is directed back towards the inner core of the chip and enables LAB 122d an alternative pathway to the inner core of the chip.

It should be appreciated that supplying an alternative communication line into the inner core of the chip will enable more flexibility, as much of the communication is between LABs, rather than external to the LABs. That is, by connecting LAB 122d to wire 142 there are now more options for LAB 122d to communicate with other LABs. Previously, LAB 122d could communicate with other LABs to the left of LAB 122d through drivers (also referred to herein as buffers) 136 and 138. Now, by connecting buffer 130-1a to wire 142 through via 126, LAB 122d may communicate with the inner LABs of the chip through buffers 130-1a, 136 or 138, i.e., the logic tends to communicate within the chip more than external to the chip. Thus, by changing where programmable connections are made additional flexibility is provided without requiring the addition of any hardware. It should be appreciated that a multiplexor is incorporated in front of each of the buffers described herein. For example, multiplexor 132 is incorporated in front of buffer 130-1a. Thus, through input stitching connections from other wires, buffer 130-1a offers the same flexibility to those other connections.

Figure 5:
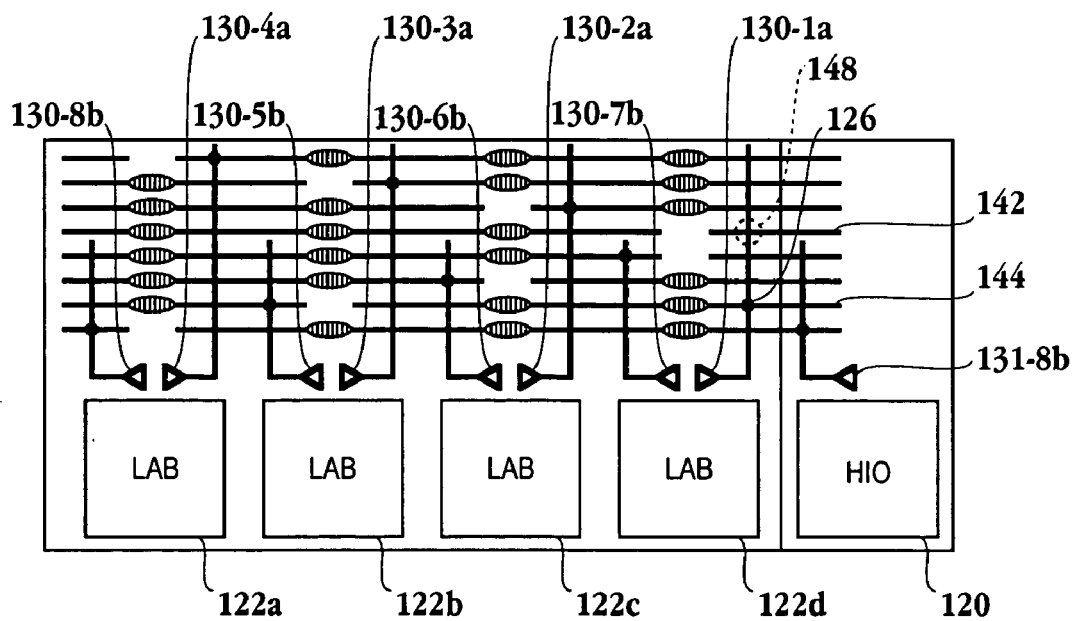
FIG. 5 is an alternative schematic diagram to FIG. 4, where

FIG. 5 is an alternative schematic diagram to FIG. 4, where FIG. 5 illustrates a change in the role of a driver through the via programming in accordance with one embodiment of the invention. Here, driver 130-1a was previously connected to wire 140 as depicted in FIG. 3. Through via programming driver 130-1a is now connected to wire 142. Thus, driver 130-1a was previously driving a right going wire, i.e., wire 140, and is now driving a left going wire, i.e., wire 142. Thus, LAB 122d has another pathway as an option for communicating with the LABs of the interior portion of the chip. It should be appreciated that the reduction in the right-going capacity is not an issue, as there are still H4 wires that communicate with the horizontal input/output block 120, as well as vertical wires and sneak-paths. Thus, by reprogramming the drivers to change from a right going wire to a left going wire the need to build additional drivers and connect these additional drivers to left going wires is not necessary, thereby saving silicon area.

Figure 6:
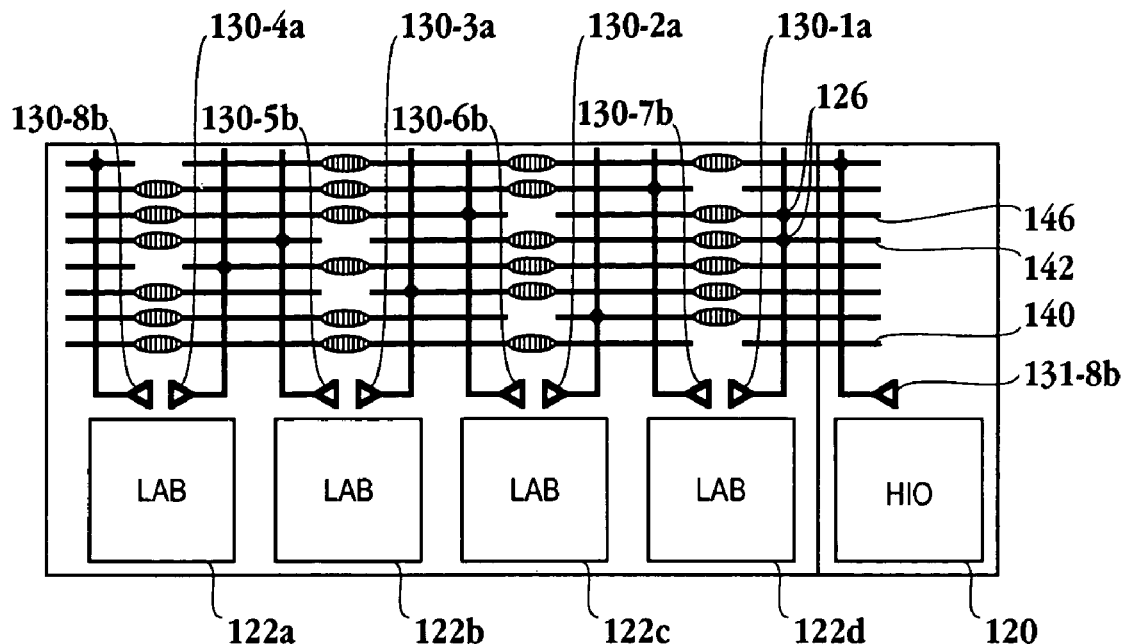
FIG. 6 is a simplified schematic diagram illustrating a driver being programmed to be re-connected to more than one undriven wire, in accordance with one embodiment of the invention.

FIG. 6 is a simplified schematic diagram illustrating a driver being programmed to be reconnected to more than one undriven wire, in accordance with one embodiment of the invention. By connecting to multiple dangling (undriven) wires, LAB 122d is offered enhanced flexibility and signal routing. For example, if LAB 122d is to communicate with LAB 122c, LAB 122d may route a signal through either of wires 142 or 146. That is, if the input to wire 146 is being used for another signal, LAB 122d may communicate with LAB 122c through line 142. Thus, there are more ways to reach the same place. In other words, through the connection to multiple wires through vias 126, a buffer is obtaining the union of the connectivity of the two dangling wires. This scheme is particularly favorable where the total capacitance of the additional wires is roughly equivalent to the normal load driven by the corresponding driver. However, design software which performs timing analysis and delays of all the wires during the design of an integrated circuit, e.g., QUARTUS design software owned by the assignee, will incorporate any capacitance differences that exist.

Figure 7:
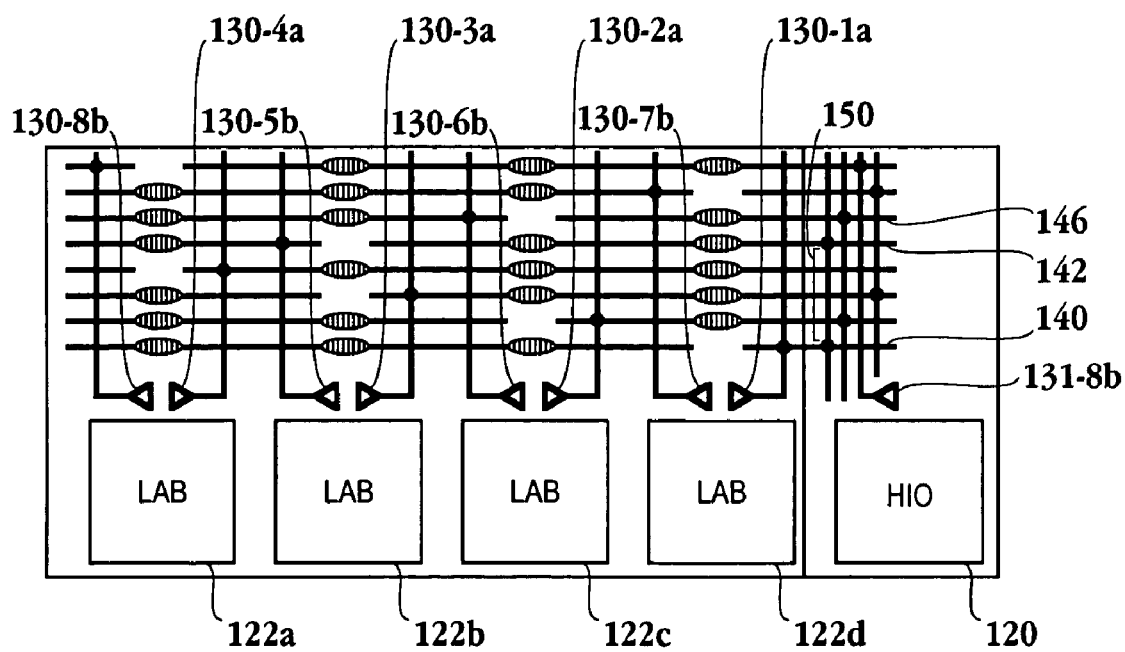
FIG. 7 is a simplified schematic diagram illustrating the addition of U-turns into the signal routing pathway through utilization of wire fragments in accordance with one embodiment of the invention.

FIG. 7 is a simplified schematic diagram illustrating the addition of U-turns into the signal routing pathway through utilization of wire fragments in accordance with one embodiment of the invention. Here, rather than directly connecting a buffer to dangling wires, extra vertical pieces of metal are added. In essence, a vertical piece of metal is used to short wires together to form the U-turn. Accordingly, a signal heading toward the edge of a chip is routed and returned back towards the center of the chip. For example, driver 130-1a associated with LAB 122d is connected to wire 142 through vertical segment 150. Thus, a signal proceeding from buffer 130a over wire 140 may access wire 142 through segment 150. Similar U-turns are shown for buffers 130-2a and 130-3a as illustrated in FIG. 7.

Figure 8:
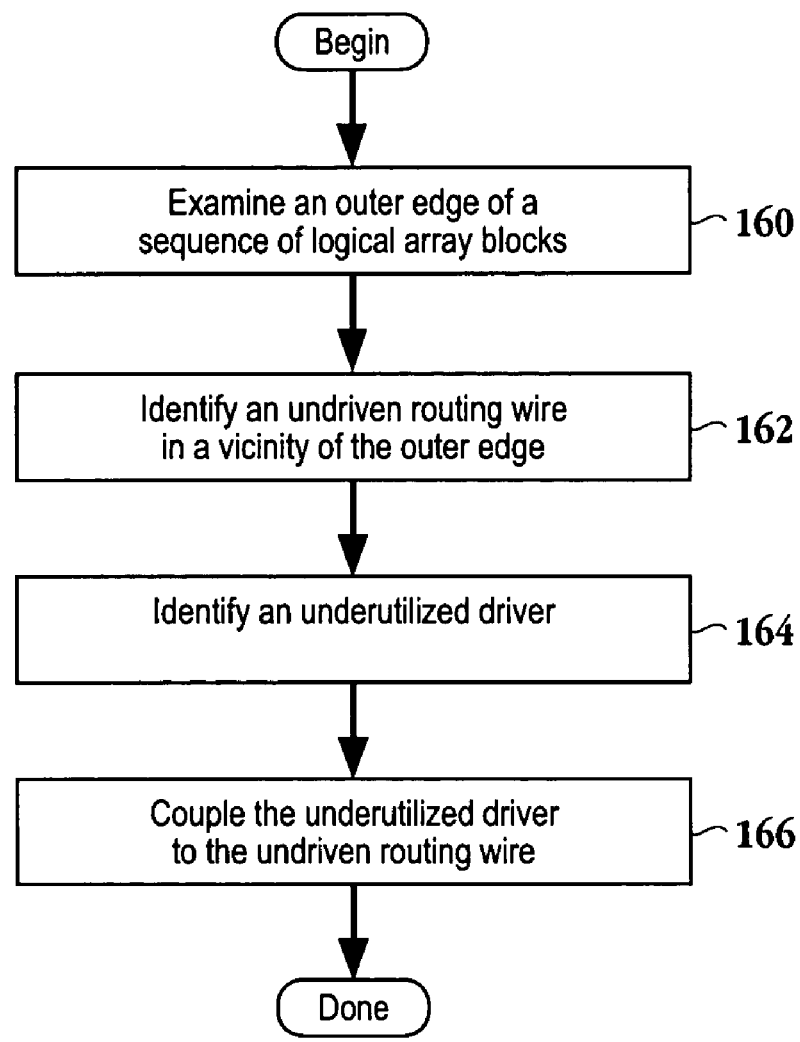
FIG. 8 is a flow chart diagram illustrating the method operations for enhancing signal routability within an integrated circuit in accordance with one embodiment of the invention.

FIG. 8 is a flow chart diagram illustrating the method operations for enhancing signal routability within an integrated circuit in accordance with one embodiment of the invention. The method initiates with operation 160 where an outer edge of a sequence of logical array blocks are examined. It should be appreciated that the outer edge may be an edge that is to the side or above a sequence of the logical array blocks. The method then advances to operation 162 where an undriven routing wire in the vicinity of the outer edge is identified. The undriven wires are wires not associated with a buffer, e.g., a tri-state buffer used to drive a wire. In one embodiment, the wire fragments depicted in FIGS. 3–7 may be identified here. It should be appreciated that an undriven routing wire may also be referred to as a dangling wire or a wire fragment. The method then proceeds to operation 164 where an underutilized driver is identified. Here, the underutilized wire may be a driver that is associated with a wire not reaching a maximum number of logical array blocks. For example, with an H4 staggering scheme, an underutilized driver may be a driver not capable of communicating with four logical array blocks due to truncation effects at the chip edge. The method then moves to operation 166 where the underutilized driver is coupled to the undriven routing wire. One skilled in the art will appreciate that this may be accomplished through programming a via as illustrated in FIGS. 3–7 described above. In one embodiment, the underutilized driver may be coupled to multiple wire fragments and may extend communication to more than 4 LABs as described with reference to FIG. 6. In another embodiment, the underutilized driver may be coupled to an additional wire to define a U-turn configuration as described with reference to FIG. 7. It should be appreciated that the embodiments described herein may be applied to multiple vias and multiple metal pieces and is not limited to programming a single via.

In summary, the above-described invention provides a method and apparatus for enhancing signal routability without adding hardware to the chip. In one embodiment, a staggered/segmented routing scheme enables enhanced flexibility by programming connections between underutilized drivers and wire fragments at the chip edge. The underutilized driver may have been previously associated with a wire fragment directed toward the edge of the chip. Through the embodiments described herein, the underutilized driver can be connected through a programmed connection to a wire directed toward the center region of the chip. In another embodiment, the underutilized driver is programmed to be connected to multiple wire fragments. Here, the multiple wire fragments may provide a u-turn configuration. It should be appreciated that while the embodiments described above reference an H4 segmented wiring scheme, the invention is not limited to this type of segmented wiring scheme. That is, the embodiments may be applied to any staggered segmented wiring scheme. Additionally, while the Figures generally refer to the right side of the chip, the embodiments may be incorporated with any edge of the chip, including the top and bottom surfaces of the chip.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations. Additionally, the PLDs according to the present invention may be included in a processor that is part of an electronic system. The electronic system may be a digital computing system such as a general or special purpose computer, or a specialized digital switching network, or other processing system.

The invention can also be embodied as computer readable code on a computer readable medium. The computer readable medium is any data storage device that can store data which can be thereafter read by a computer system. The computer readable medium also includes an electromagnetic carrier wave in which the computer code is embodied. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for enhancing signal routability within an integrated circuit, comprising the operations of:
    examining an outer edge of a sequence of logical array blocks;
    identifying an undriven routing wire in a vicinity of the outer edge;
    identifying an underutilized driver; and
    coupling the underutilized driver to the undriven routing wire.

2. The method of claim 1, wherein the method operation of identifying an underutilized driver includes,
    determining a first number of logical array blocks associated with a driver;
    determining a second number of logical array blocks associated with the undriven routing wire; and
    classifying the driver as the underutilized driver when the first number is less than the second number.

3. The method of claim 1, wherein the method operation of coupling the underutilized driver to the undriven routing wire includes,
    de-coupling the underutilized driver from an associated routing wire.

4. The method of claim 3, wherein at least a portion of the undriven routing wire is directed away from the outer edge.

5. The method of claim 1, further comprising:
    coupling the underutilized driver to multiple undriven routing wires.

6. The method of claim 5, wherein the method operation of coupling the underutilized driver to multiple undriven routing wires includes,
    establishing a connection between a routing wire associated with the underutilized driver and at least one of the multiple undriven routing wires.

7. The method of claim 1, wherein the method operation of coupling the underutilized driver to the undriven routing wire includes,
    connecting a routing wire associated with the underutilized driver to the undriven wire.

8. The method of claim 1, wherein the underutilized driver is associated with a wire directed toward the outer edge and the undriven routing wire is directed away from the outer edge.

9. A computer readable medium having program instructions for enhancing signal routability within an integrated circuit, comprising:
    program instructions for identifying an undriven routing wire in a vicinity of an outer edge of the integrated circuit;
    program instructions for identifying an underutilized driver; and
    program instructions for coupling the underutilized driver to the undriven routing wire.

10. The computer readable medium of claim 9, wherein the program instructions for identifying an underutilized driver includes,
    program instructions for determining a first number of logical array blocks associated with a driver;
    program instructions for determining a second number of logical array blocks associated with the undriven routing wire; and
    program instructions for classifying the driver as the underutilized driver when the first number is less than the second number.

11. The computer readable medium of claim 9, wherein the program instructions for coupling the underutilized driver to the undriven routing wire includes,
    program instructions for de-coupling the underutilized driver from an associated routing wire.

12. The computer readable medium of claim 9, further comprising:
    program instructions for coupling the underutilized driver to multiple undriven routing wires.

13. The computer readable medium of claim 12, wherein the program instructions for coupling the underutilized driver to multiple undriven routing wires includes,
    program instructions for establishing a connection between a routing wire associated with the underutilized driver and at least one of the multiple undriven routing wires.

14. A programmable logic array integrated circuit, comprising:
    an array of logical array blocks (LABs);
    a plurality of driven wires defining a routing pattern between the LABs, a portion of the plurality of the driven wires associated with underutilized drivers;
    a plurality of undriven wires located proximate to outer edges of the array of LABs; and
    a first via providing a first connection between a first one of the plurality of undriven wires and an underutilized driver.

15. The integrated circuit of claim 14, wherein the first one of the plurality of undriven wires proceeds farther into a center region of the array of LABs than a routing wire associated with the underutilized driver.

16. The integrated circuit of claim 14, wherein each respective wire of a subset of the plurality of driven wires is in communication with four of the LABs.

17. The integrated circuit of claim 14, wherein a routing wire associated with the underutilized driver is configured to provide communication with a number of LABs, the number of LABs being between 1 and 3, inclusive.

18. The integrated circuit of claim 14, further comprising:
a second via providing a second connection between a second one of the plurality of undriven wires and the underutilized driver.

19. The integrated circuit of claim 18, further comprising:
a third via providing a third connection between a third one of the plurality of undriven wires and the underutilized driver.

20. The integrated circuit of claim 19, wherein the first, second, and third one of the plurality of undriven wires are configured to define a u-turn proximate to one of the outer edges of the array of LABs.

21. The integrated circuit of claim 14, wherein each of the plurality of driven wires is associated with a buffer.

22. The integrated circuit of claim 21, wherein each buffer is associated with a multiplexor.

23. The integrated circuit of claim 14, wherein the routing pattern is a segmented routing pattern.

* * * * *